United States Patent
Onakado

(10) Patent No.: US 9,209,218 B2
(45) Date of Patent: Dec. 8, 2015

(54) INFRARED SOLID-STATE IMAGING DEVICE

(71) Applicant: Mitsubishi Electric Corporation, Chiyoda-ku (JP)

(72) Inventor: Takahiro Onakado, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/487,196

(22) Filed: Sep. 16, 2014

(65) Prior Publication Data

US 2015/0097157 A1    Apr. 9, 2015

(30) Foreign Application Priority Data

Oct. 3, 2013  (JP) .................................. 2013-208411

(51) Int. Cl.
| | |
|---|---|
| *H01L 29/06* | (2006.01) |
| *H01L 31/072* | (2012.01) |
| *H01L 31/109* | (2006.01) |
| *H01L 31/0328* | (2006.01) |
| *H01L 31/0336* | (2006.01) |
| *H01L 27/146* | (2006.01) |
| *H01L 31/0304* | (2006.01) |
| *H01L 31/0352* | (2006.01) |

(52) U.S. Cl.
CPC .... *H01L 27/14649* (2013.01); *H01L 27/14629* (2013.01); *H01L 31/0304* (2013.01); *H01L 31/035236* (2013.01)

(58) Field of Classification Search
CPC . H01L 27/46; H01L 31/0352; H01L 31/0304; H01L 27/14649; H01L 27/14629
USPC .......................................................... 257/21
See application file for complete search history.

(56) References Cited

U.S. PATENT DOCUMENTS

| | | | |
|---|---|---|---|
| 7,415,185 B2 * | 8/2008 | Nakaji et al. .................. | 385/131 |
| 2008/0283728 A1 * | 11/2008 | Inoue ......................... | 250/208.1 |
| 2011/0042647 A1 | 2/2011 | Choi | |
| 2011/0073762 A1 | 3/2011 | Soma et al. | |
| 2012/0211858 A1 * | 8/2012 | Tsuchiya ...................... | 257/467 |

FOREIGN PATENT DOCUMENTS

JP        2011-077165        4/2011

OTHER PUBLICATIONS

Manijeh Razeghi et al. "State-of-the-art Type II Antimonide-based superlattice photodiodes for infrared detection and imaging", Proc. of SPIE vol. 7467, 2009, 13 pages.

* cited by examiner

*Primary Examiner* — Phuc Dang
(74) *Attorney, Agent, or Firm* — Oblon, McClelland, Maier & Neustadt, L.L.P.

(57) ABSTRACT

An infrared solid-state imaging device with unit detecting sections in a matrix form, wherein the unit detecting section includes: an infrared light guiding layer; a first reflecting layer on the infrared light guiding layer; an infrared light detecting section on the first reflecting layer, the infrared light detecting section including an infrared light absorbing layer and upper and lower contact layers; and first metal wiring connected to the upper contact layer, wherein a side wall of the unit detecting section is inclined at an angle smaller than 45° to a normal direction, to form a groove between the adjacent unit detecting sections, a first insulating layer is provided on the side wall of the unit detecting section and second metal wiring is provided on the first insulating layer, and a refractive index of the first reflecting layer is lower than that of the lower contact layer.

17 Claims, 12 Drawing Sheets

INFRARED SOLID-STATE IMAGING DEVICE

CROSS-REFERENCE TO RELATED APPLICATIONS

This application is based upon and claims the benefit of priority from prior Japanese Patent Application No. 2013-208411 filed Oct. 3, 2013, the entire contents of which are incorporated herein by reference.

BACKGROUND OF THE INVENTION

1. Field of the Invention

The present invention relates to an infrared solid-state imaging device for detecting infrared light by means of two-dimensionally arrayed quantum-type semiconductor detecting section pixels, and particularly relates to an infrared solid-state imaging device provided with a compound semiconductor detecting section pixel or a type-II superlattice detecting section pixel, which necessarily contains Sb or In and consists of at least two elements out of elements Ga, Sb, In, As and Al.

2. Description of the Related Art

A quantum-type infrared solid-state imaging device has advantages of having high sensitivity and high-speed responsiveness since the quantum-type infrared solid-state imaging device treats infrared light as photons and uses mutual interaction between the photons and electrons in a semiconductor, and with those high sensitivity and high-speed responsiveness, the quantum-type infrared solid-state imaging device has been a key device in a variety of applications. Systems of this quantum-type infrared solid-state imaging device include an intrinsic system using a narrow band gap material capable of absorbing infrared light, and as the material, HgCdTe, InSb or the like being a compound semiconductor is used. Further, other systems recently attracting attention include a type-II superlattice system. In the type-II superlattice system, for example, a III-V group compound semiconductor system superlattice containing Sb, which is made up of thin layers of InAs and GaSb (or GaInSb), is formed on a GaSb substrate, and infrared light is absorbed through use of shifts between minibands which occur in the superlattice structure and between layers. A cutoff wavelength is adjustable from 3 to 25 µm, and the wavelength is adjustable not by means of a composition as in the HgCdTe intrinsic system, but by means of a film thickness. As compared to the HgCdTe intrinsic system, the type-II superlattice system has carriers with a larger effective mass, and with theoretically the same cutoff wavelength used, it is operated at a higher temperature by 30 K in a band with a wavelength of 10 µm and at a higher temperature by 10 K in a band with a wavelength of 3 to 5 µm. Further, since the type-II superlattice system can be applied with the III-V group compound semiconductor technique, it is expected to be manufactured more easily at lower cost as compared to the HgCdTe intrinsic system, and the type-II superlattice system is currently under active development. In a conventional quantum-type infrared solid-state imaging device having an intrinsic-system compound semiconductor detecting section or a type-II-superlattice-system detecting section, a groove (mesa) structure is formed and an insulating layer is embedded into the groove, to separate pixels (Manijeh Razeghi et. al. "State-of-the-art Type II Antimonide-based superlattice photodiodes for infrared detection and imaging", Proc. of SPIE, Vol. 7467, pp. 74670T (FIGS. 4 and 7)).

SUMMARY OF THE INVENTION

When a material system with a narrow band gap is used as the material for the quantum-type infrared solid-state imaging device, the material system needs to be cooled to approximately 77 K to 150 K in order to reduce dark current noise, and freezing means is thus required. For this reason, a size and consumption power at the time of applying the quantum-type infrared solid-state imaging device to an infrared camera increase. When a dark current value at the same temperature can be reduced here, a high-temperature operation as well as a high S/N of an image is made possible, thereby allowing reduction in size and power consumption of the freezing means. Hence it is highly important to reduce dark current noise.

However, as for a pixel of a quantum-type infrared solid-state imaging device having a compound semiconductor detecting section (e.g., a compound semiconductor detecting section of InSb, InAsSb, InAs etc.) or a type-II superlattice detecting section (e.g., a detecting section using a GaSb/InAs type-II superlattice, an InGaSb/InAs type-II superlattice, an InAs/InAsSb type-II superlattice etc.), which necessarily contains Sb or In and consists of at least two elements out of elements Ga, Sb, In, As and Al, although the pixel has the advantages as described above, the pixel has a problem that a leakage current caused by SRH (Schockley-Read-Hall) generation is high and a dark current is high. Especially in theoretical characteristic prediction for the latter type-II superlattice, as compared to the HgCdTe intrinsic system, with theoretically the same cutoff wavelength used, it is operated at a higher temperature by 30 K in a band with a wavelength of 10 µm and at a higher temperature by 10 K in a band with a wavelength of 3 µm to 5 µm. However, since the leakage current caused by SRH generation is high, the theoretical characteristic prediction value cannot be achieved.

Accordingly, an object of the present invention is to provide a quantum-type infrared solid-state imaging device having a compound semiconductor detecting section or a type-II superlattice detecting section, which necessarily contains Sb or In and consists of at least two elements out of elements Ga, Sb, In, As and Al, wherein a total amount of all dark current noise including a leakage current caused by SRH generation is reduced without impairing sensitivity characteristics (mass efficiency).

The present invention is an infrared solid-state imaging device provided with a plurality of unit detecting sections in a matrix form, wherein the unit detecting section includes: an infrared light guiding layer; a first reflecting layer provided on the infrared light guiding layer; an infrared light detecting section provided on the first reflecting layer, the infrared light detecting section including an infrared light absorbing layer for absorbing infrared light, an upper contact layer provided on the infrared light absorbing layer, and a lower contact layer provided under the infrared light absorbing layer; and first metal wiring electrically connected to the upper contact layer, wherein a side wall of the unit detecting section is inclined at a taper angle smaller than 45° with respect to a normal direction of a bottom surface of the infrared light guiding layer, to form a groove between the unit detecting sections adjacent to each other, a first insulating layer is provided on the side wall of the unit detecting section and second metal wiring is provided on the first insulating layer, and a refractive index of the first reflecting layer is lower than a refractive index of the lower contact layer.

With the infrared solid-state imaging device of the present invention, infrared light is adsorbed in a long beam distance due to multipath, allowing improvement in sensitivity characteristics (mass efficiency). As a result, it is possible to reduce a volume of the infrared light absorbing layer as compared to in the conventional case, and to reduce a dark current generated in proportion to the volume of the infrared light absorbing layer, so as to achieve a high S/N ratio and a high-temperature operation, and to prevent a cross talk caused by leakage of infrared light to an adjacent pixel.

DETAILED DESCRIPTION OF THE PREFERRED EMBODIMENTS

First Embodiment

Figure 1:
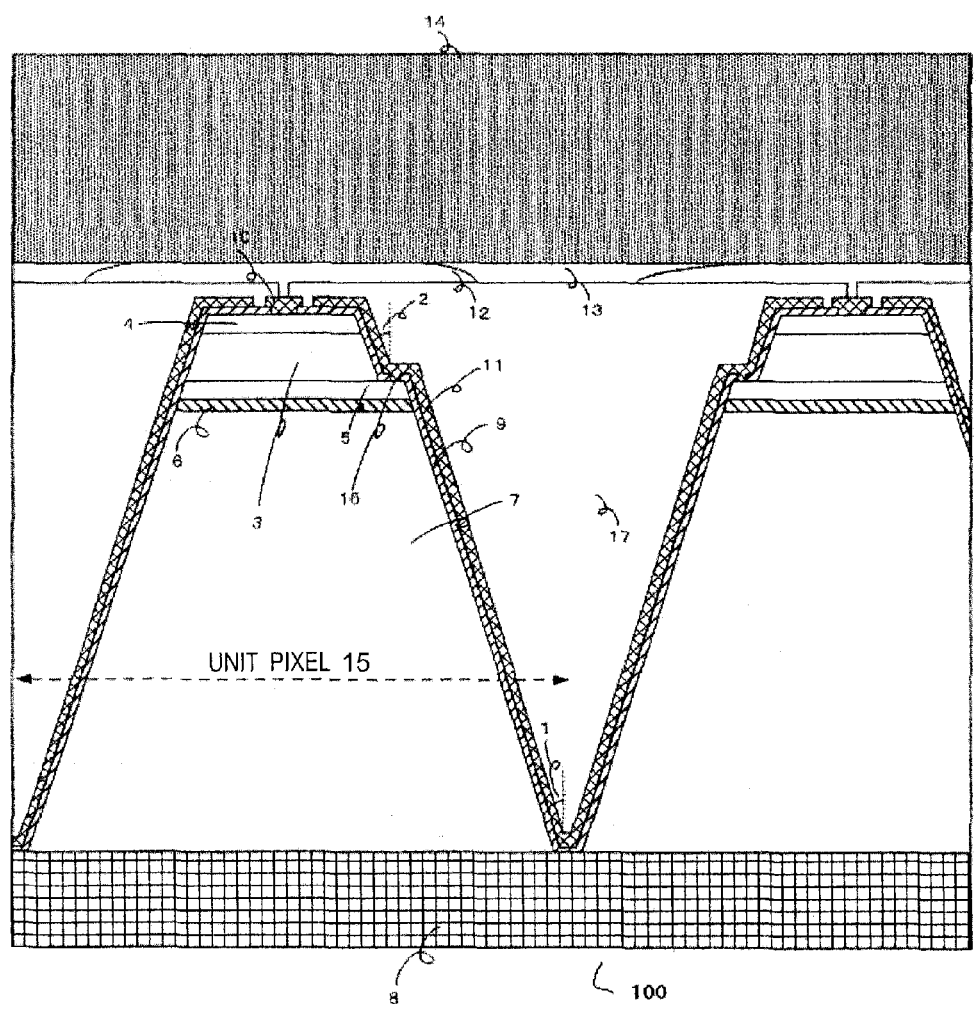
FIG. 1 is a sectional view of an infrared solid-state imaging device according to a first embodiment of the present invention.
Figure 2:
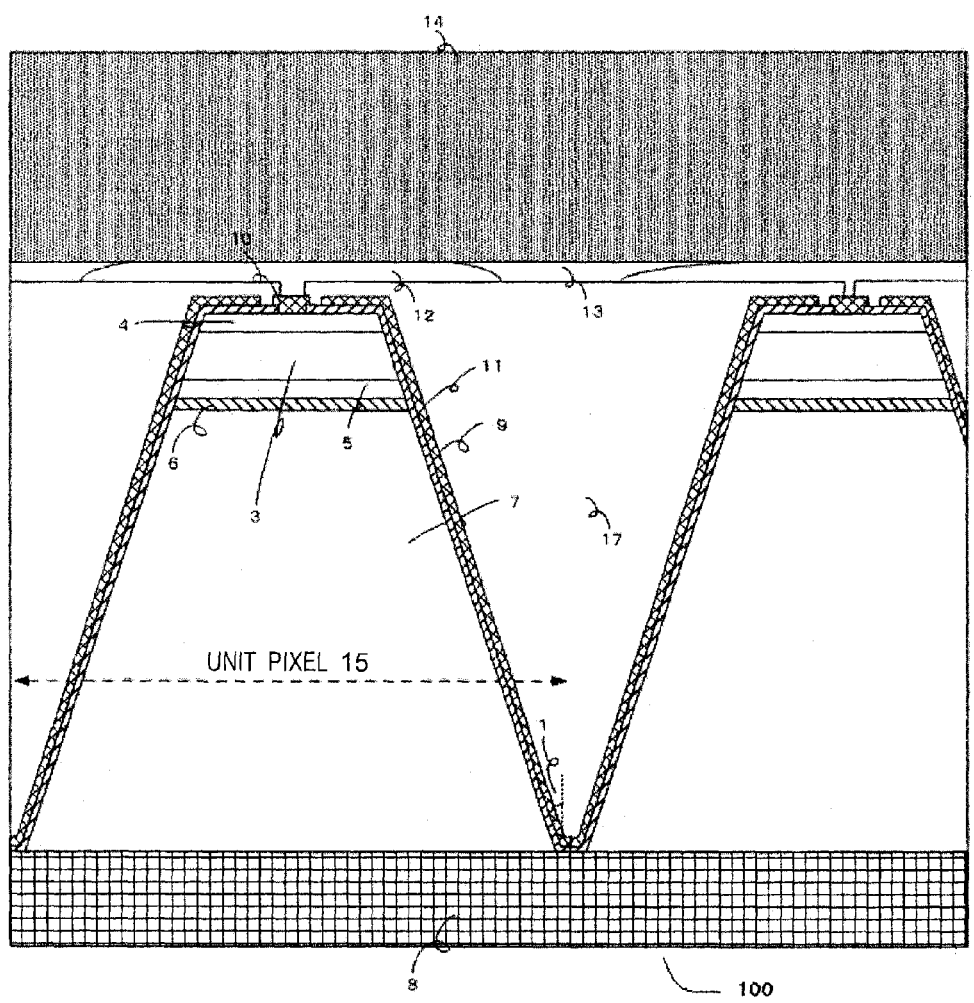
FIG. 2 is a sectional view of the infrared solid-state imaging device according to the first embodiment of the present invention.

FIG. 1 is a sectional view of an infrared solid-state imaging device according to a first embodiment of the present invention, generally denoted by numeral 100. Further, FIG. 2 is a sectional view of the infrared solid-state imaging device 100 in a direction orthogonal to FIG. 1. It is to be noted that a cross-sectional direction (lateral direction in the drawing page) of FIG. 1 is referred to as a first direction and a cross-sectional direction of FIG. 2 is referred to as a second direction.

The infrared solid-state imaging device 100 includes a plurality of unit pixels 15 arranged in a matrix form in the first and second directions. The unit pixel 15 has an infrared light absorbing layer 3 for absorbing infrared light, an upper contact layer 4 formed on the infrared light absorbing layer 3, and a lower contact layer 5 formed under the infrared light absorbing layer 3, and these layers form a pin structure. First metal wiring 10 connected to the upper contact layer 4 is provided on the upper contact layer 4, and a first reflecting layer 6 with a lower refractive index than that of the lower contact layer 5 is provided under the lower contact layer 5. An infrared light guiding layer 7 with a higher refractive index than that of the first reflecting layer 6 is provided under the first reflecting layer 6, and a second reflecting layer 8 with a lower refractive index than that of the infrared light guiding layer 7 is provided under the infrared light guiding layer 7. An arbitrary layer may exist under the second reflecting layer 8.

As described later, the unit pixel 15 is formed by crystal growth on a compound semiconductor substrate (not shown), and thereafter, the compound semiconductor substrate is made thinner from the rear surface side. Although not shown in FIGS. 1 and 2, part of the thinned compound semiconductor substrate may remain under the second reflecting layer 8, or there may be no layer remaining under the second reflecting layer 8 as in FIGS. 1 and 2.

The unit pixel 15 is configured of a compound semiconductor detecting section or a type-II superlattice detecting section, which necessarily contains Sb or In and consists of at least two elements out of elements Ga, Sb, In, As and Al.

As the compound semiconductor detecting section, for example, a compound semiconductor detecting section of InSb, InAsSb, InAs or the like is used. When InSb is taken as an example, the detecting section is formed with the pin structure, that is, the upper contact layer 4 is formed of a p-type InSb layer, the infrared light absorbing layer 3 is formed of an InSb layer with a low impurity concentration, and the lower contact layer 5 is formed of an n-type InSb layer. Naturally, positions of the p-type and the n-type may be reversed, and as a nip structure, the upper contact layer 4 may be an n-type InSb layer and the lower contact layer 5 may be a p-type InSb layer.

On the other hand, as the type-II superlattice detecting section, there is, for example, a detecting section using a GaSb/InAs type-II superlattice, an InGaSb/InAs type-II superlattice, an InAs/InAsSb type-II superlattice, or the like. When the GaSb/InAs type-II superlattice is taken as an example, the detecting section is formed with the pin structure, that is, the upper contact layer 4 is formed of a p-type GaSb/InAs type-II superlattice layer, the infrared light absorbing layer 3 is formed of a GaSb/InAs type-II superlattice layer with a low impurity concentration, and the lower contact layer 5 is formed of an n-type GaSb/InAs type-II superlattice layer.

In the case of designing the GaSb/InAs type-II superlattice layer targeted at a mid-wavelength infrared wavelength band where a wavelength not larger than 5 μm is, for example, taken as a cutoff wavelength, the GaSb/InAs type-II superlattice layer is obtained by using combination of two kinds of semiconductor thin layers, a GaSb film and an InAs film, and repeatedly laminating the layers 100 to 600 times with such a film-thickness configuration as four GaSb monolayers and ten InAs monolayers, to form a laminated structure. An absorption wavelength of infrared light can be adjusted by changing the film-thickness configuration of the GaSb layer and the InAs layer, and the film-thickness configuration is formed in accordance with a desired absorption wavelength.

In the infrared solid-state imaging device 100, the unit pixel 15 on the second reflecting layer 8 is etched and a groove is formed, to form a pixel array where pixels are two-dimensionally arrayed as separated by the grooves. The groove has a groove taper angle 1 larger than 0° and smaller than 45° with respect to a normal of the front surface of the second reflecting layer 8 in both directions, i.e., the first direction of the two-dimensional pixel array and the second direction perpendicular to the first direction. At least part of the second reflecting layer 8 is located in contact with the lowermost part of the groove.

A first insulating layer 9 is formed on a side wall of the groove, and second metal wiring 11 is formed thereon. The second metal wiring 11 is electrically connected to the lower contact layer 5 in an electric connection section 16. The electric connection section 16 is formed only in the first direction and is not formed in the second direction, but may naturally be formed both in the first and second directions.

Further, although the electric connection section 16 is formed only in the right-side groove in FIG. 1, it may be formed only in the left-side groove, or may be formed in the both-side grooves. In the cross section where the electric connection section 16 is formed, a groove above the electric connection section 16 is also formed using a groove taper angle 2 being the same angle as the groove taper angle 1.

The groove is embedded with a second insulating layer 17. As the first insulating layer 9, there is, for example, used an insulating film such as a silicon oxide film, a silicon nitride film, aluminum oxide, aluminum nitride or magnesium fluoride. As the first metal wiring 10 and the second metal wiring 11, there is, for example, used gold, aluminum, titanium, platinum or a film formed by laminating some of metal layers of these. As the second insulating layer 17, there is, for example, used a silicon oxide film, a silicon nitride film, aluminum oxide, aluminum nitride, a polyimide film, or a laminated film of some of these.

Figure 3:
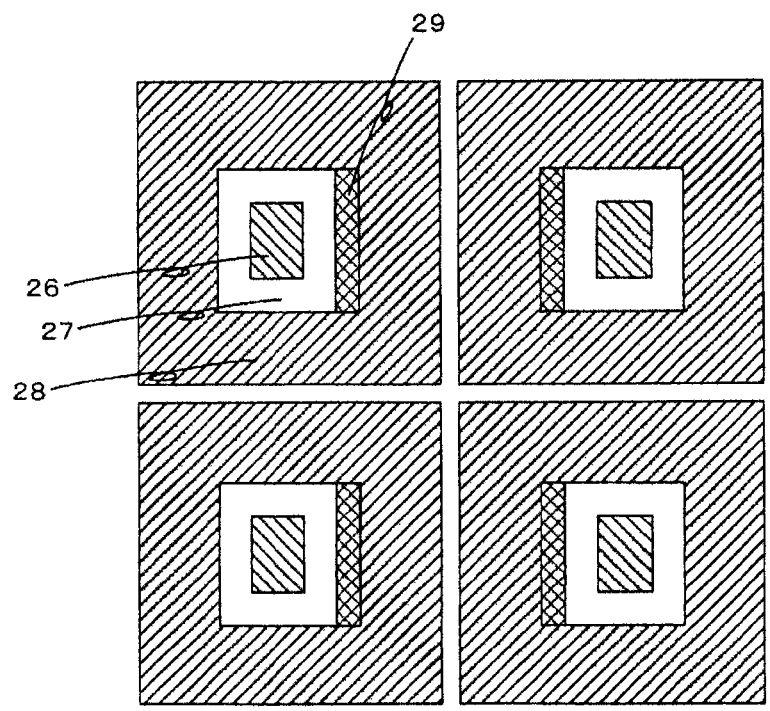
FIG. 3 is a plan view of the infrared solid-state imaging device according to the first embodiment of the present invention.

FIG. 3 is a plan view of the infrared solid-state imaging device 100 according to the first embodiment of the present invention, and illustrates a 2×2-pixel array. An upper flat region 26 is at the center, and on its periphery, there exist a region 27 with the groove taper angle 2, a region 28 with the groove taper angle 1, and a flat region 29 where an electric connection section of the second metal wiring to the lower contact layer is formed. Although each pattern of the upper flat region 26 and the like in FIG. 3 is made rectangular, a corner of each pattern may be rounded.

As thus described, the detecting section with the pin structure, namely the compound semiconductor detecting section or the type-II superlattice detecting section, is generally formed on a compound semiconductor substrate such as a GaSb substrate, a GaAs substrate, an InSb substrate or an InP substrate.

In a typical manufacturing method, crystal growth of a buffer layer is made on the compound semiconductor substrate by use of a molecular beam epitaxy apparatus, a metal organic chemical vapor deposition apparatus, or the like, and thereafter, crystal growth of the second reflecting layer 8, the infrared light guiding layer 7, the first reflecting layer 6, the lower contact layer 5, the infrared light absorbing layer 3 and the upper contact layer 4 are successively made.

Next, a groove is formed by patterning using photolithography, etching (this is either dry etching by use of plasma or wet etching by use of a chemical solution, or both etching may be used; hereinafter simply referred to as "etching"), and the like. In order to form two grooves, the groove with the taper angle 1 and the groove with the taper angle 2, it is necessary to perform, for example, combination of photolithography and etching at two stages.

In the formed groove, the first insulating layer 9 is deposited by use of an apparatus such as a chemical vapor deposition apparatus, and by patterning by means of photolithography and etching, an opening pattern of the first insulating layer 9 for exposing the upper contact layer 4 and an opening pattern (a portion of the electric connection section 16 of the second metal wiring to the lower contact layer) of the first insulating layer 9 for exposing the lower contact layer 5 are formed.

Next, a metal wiring film to be the first metal wiring 10 and the second metal wiring 11 is formed by means of a sputtering apparatus or the like. The metal wiring film is separated into the first metal wiring 10 and the second metal wiring 11 by patterning by means of photolithography and etching. Further, the second insulating layer 17 is embedded by the chemical vapor deposition apparatus, the sputtering apparatus or the like, and the opening pattern is formed in the first metal wiring 10 by patterning by means of photolithography and etching. A metal film of indium or the like to become a bump electrode is formed as connected to the first metal wiring 10 by the vapor deposition apparatus, the sputtering apparatus or the like, and the bump electrode 12 is formed by patterning by means of photolithography and etching.

Figure 4:
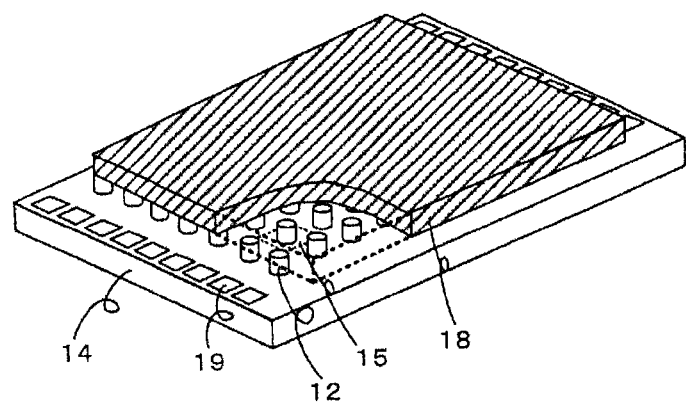
FIG. 4 is a perspective view of the infrared solid-state imaging device according to the first embodiment of the present invention.

After each layer has been formed on the compound semiconductor substrate as thus described, each chip is cut out by dicing therefrom, to form a two-dimensional array 18 pixels each made up of the compound semiconductor detecting section or the type-II superlattice detecting section. As shown in FIG. 4, the formed two-dimensional array 18 of the pixels is hybrid-connected with a silicon reading circuit chip 14 in a similar manner to the conventional quantum-type infrared solid-state imaging device.

The first metal wiring 10 of each pixel of the two-dimensional pixel array is connected with the bump electrode 12 made of indium, for example. Further, also in the silicon reading circuit chip 14, in order to read an electric charge output of each pixel of the two-dimensional pixel array, a reading circuit input terminal is extracted corresponding to each pixel, to form a bump electrode.

As shown in FIG. 4, the two-dimensional pixel array 18 and the silicon reading circuit chip 14 allows corresponding bump electrodes for each pixel to mechanically and electrically connect to each other by bump connection (hybrid connection). In FIG. 4, the two-dimensional array 18 and the silicon reading circuit chip 14 are connected such that the second reflecting layer 8 of the two-dimensional array 18 serves as an upper surface.

After the bump connection, generally, an underfill film 13 made of an epoxy resin is poured into a gap in the bump connection region (bump electrodes 12).

Thereafter (or, before the bump connection), generally, the compound semiconductor substrate is made thinner from the rear surface side by any of polishing, graving or etching, or by combination of these. Finally, as shown in FIGS. 1 and 2, a quantum-type infrared solid-state imaging device with a hybrid structure is formed where the two-dimensional array 18 formed by two-dimensionally arraying the unit pixels 15 is mechanically and electrically connected with the silicon reading circuit chip 14 by the bump electrode 12 and the underfill film 13 for each pixel. FIG. 4 is a perspective view of the completed quantum-type infrared solid-state imaging device with the hybrid structure.

Next, an operation of the quantum-type infrared solid-state imaging device according to the first embodiment will be described in comparison with the conventional structure (FIG. 5), taking the case of the detecting section formed with the pin structure as an example.

Figure 5:
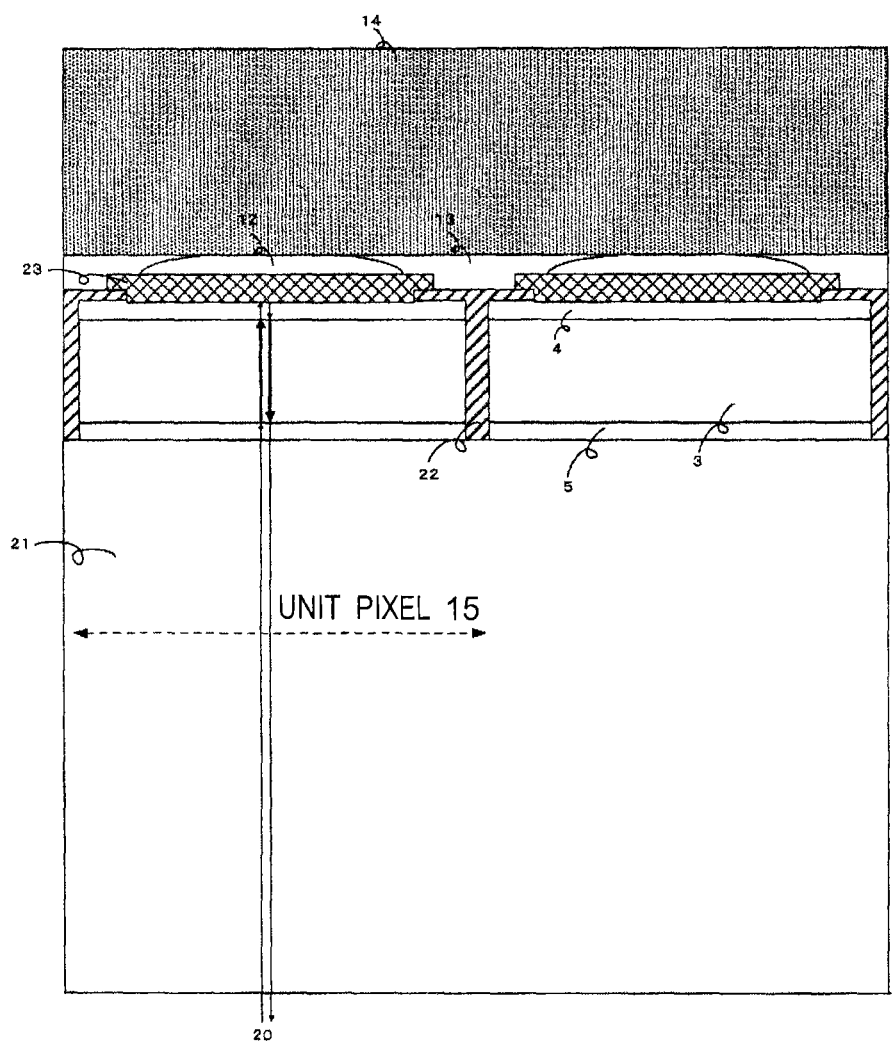
FIG. 5 is a sectional view of a conventional infrared solid-state imaging device.

FIG. 5 is a sectional view of the conventional infrared solid-state imaging device. In the conventional infrared solid-state imaging device, a unit pixel 15 has an infrared light absorbing layer 3 with a low impurity concentration which absorbs infrared light, a p-type upper contact layer 4 on the infrared light absorbing layer 3, and an n-type lower contact layer 5 under the infrared light absorbing layer 3. Metal wiring 23 is connected to the upper contact layer 4, and an n-type buffer layer 21 is formed under the lower contact layer 5.

The pixels are separated by forming a groove in the infrared light absorbing layer 3, the upper contact layer 4 and the lower contact layer 5, and an insulating layer 22 is embedded into the groove. The upper contact layer 4 is connected on the metal wiring 23 and bump-connected to a silicon reading circuit chip 14 via a bump 12. After the bump connection, an underfill film 13 made of an epoxy resin is poured into a gap in the bump connection region. Thereafter, the compound semiconductor substrate is made thinner from the rear surface side.

Finally, as shown in FIG. 5, there is formed a quantum-type infrared solid-state imaging device with a hybrid structure where the two-dimensional array 18 formed by two-dimensionally arraying the unit pixels 15 is mechanically and electrically connected with the silicon reading circuit chip 14 by the bump electrode 12 and the underfill film 13 for each pixel.

In the conventional quantum-type infrared solid-state imaging device, as shown in FIG. 5, when incident infrared light 20 is incident from the rear surface (the lower side of FIG. 5), it enters the infrared light absorbing layer 3 via a buffer layer 21 and the lower contact layer 5, and is reflected on the metal wiring 23 via the upper contact layer 4. In a reversed path, the reflected infrared light travels through the upper contact layer 4, the infrared light absorbing layer 3, the lower contact layer 5 and the buffer layer 21, and goes outside again. In this infrared light path, the infrared light is absorbed in the infrared light absorbing layer 3 and photoelectric conversion occurs in the beam path from bottom to top and the beam path from top to bottom after reflection in the infrared light absorbing layer 3 (indicated by thick arrows in FIG. 5). It is thus necessary to make a film thickness of the absorption layer large in order to absorb infrared light with high efficiency. That is, it is necessary to make the film thickness of the infrared light absorbing layer 3 large so that a total distance of the beam path from bottom to top and the beam path from top to bottom after reflection is sufficiently long, and for example, the infrared light absorbing layer 3 with a film thickness not smaller than 3 μm is used.

Figure 6:
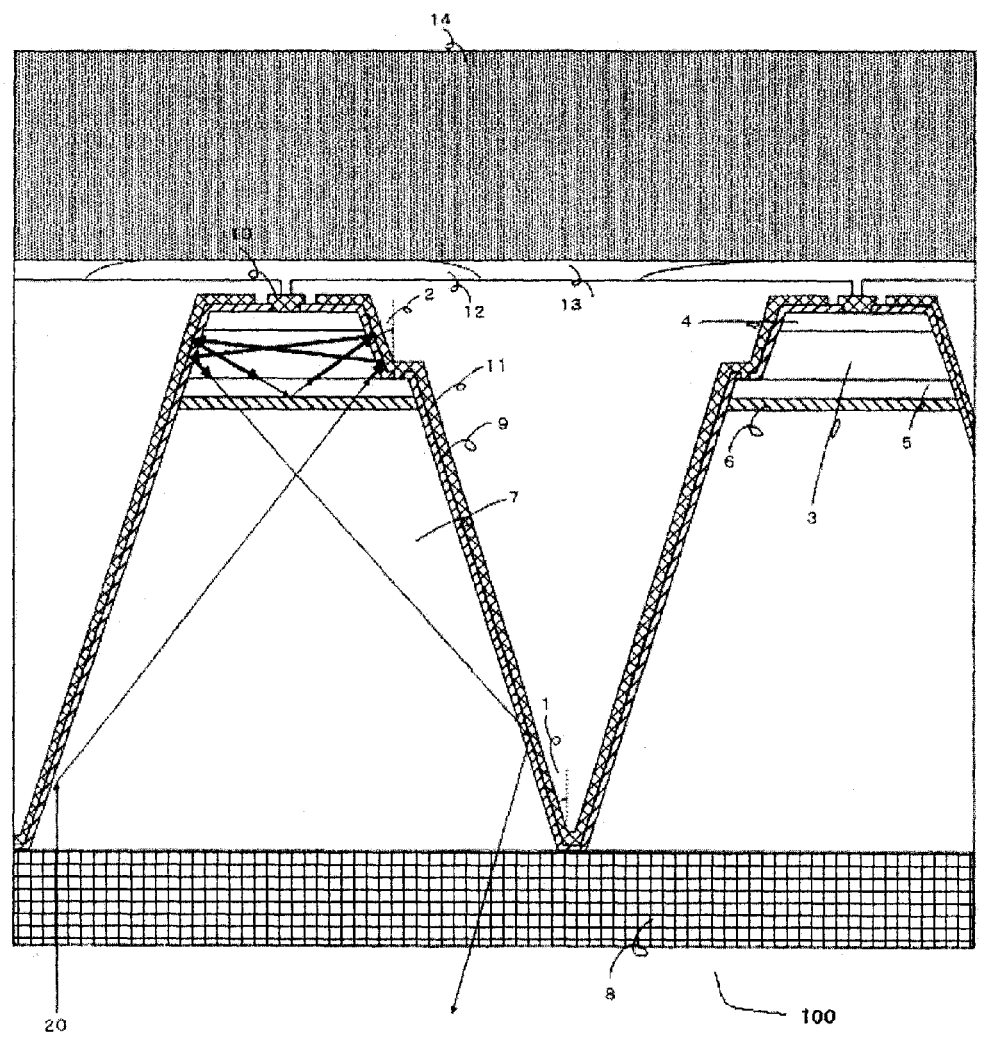
FIG. 6 is a sectional view of the infrared solid-state imaging device according to the first embodiment of the present invention.

Next, an operation of the quantum-type infrared solid-state imaging device 100 according to the embodiment of the present invention will be described with reference to FIG. 6. FIG. 6 is a sectional view of the quantum-type infrared solid-state imaging device 100 according to the first embodiment of the present invention. For example, the infrared light 20 incidenting from the rear surface (the lower side of FIG. 6) is reflected by the first insulating layer 9 and the second metal wiring 11 which are formed on a left-side groove side wall. By this reflection, the infrared light returns to the infrared light guiding layer 7 again and travels obliquely right upward. It is to be noted that, when the groove taper angle 1 is not smaller than 45°, this reflected light travels in a horizontal direction or in an obliquely downward direction from the horizontal, and the light cannot be incident on the infrared light absorbing layer 3 in the upper part. Hence the groove taper angle 1 needs to be made larger than 0° and smaller than 45°.

The reflected infrared light 20 is incident in the infrared light absorbing layer 3. It is re-reflected by the first insulating layer 9 and the second metal wiring 11 which are formed on a right-side groove side wall inside the infrared light absorbing layer 3, and travels obliquely left upward inside the infrared light absorbing layer 3. Further, the infrared light 20 is reflected by the first insulating layer 9 and the second metal wiring 11 which are formed on the left-side groove side wall, and travels obliquely right downward inside the infrared light absorbing layer 3. Finally, it reaches an interface between the lower contact layer 5 and the first reflecting layer 6 via the lower contact layer 5.

Here, as described above, the first reflecting layer 6 is formed of a film with a lower refractive index than that of the lower contact layer 5. For example, when a film with a refractive index of 3.8 is used as the lower contact layer 5 and a film with a refractive index of 3.1 is used as the first reflecting layer 6, a critical angle is about 55°. That is, infrared light incident at an angle larger than 55° is reflected.

As for the infrared light absorbing 20 shown in FIG. 6, the infrared light having reached the interface between the lower contact layer 5 and the first reflecting layer 6 has an incident angle not smaller than 55°, and it is further reflected on this interface and travels obliquely right upward. It is then re-reflected by the first insulating layer 9 and the second metal wiring 11 which are formed on the right-side groove side wall, and travels obliquely left downward. It is then reflected by the first insulating layer 9 and the second metal wiring 11 which are formed on the left-side groove side wall, and travels obliquely right downward. Finally, the incident angle becomes smaller than the critical angle of 55° on the interface between the lower contact layer 5 and the first reflecting layer 6, and the infrared light passes through the first reflecting layer 6 and is incident on the infrared light guiding layer 7. It is reflected by the first insulating layer 9 and the second metal wiring 11 which are formed on the right-side groove side wall, and goes outside through the second reflecting layer 8.

As thus described, in the quantum-type infrared solid-state imaging device 100 according to the first embodiment of the present invention, inside the infrared light absorbing layer 3, multiple reflection of the infrared light 20 occurs by the first insulating layer 9 and the second metal wiring 11 on the groove, the first metal wiring 10 located in the upper part (or the first insulating layer and the second metal wiring), and the first reflecting layer located in the lower part. This can cause infrared light absorption in a long beam distance (indicated by thick arrows in FIG. 6) due to multipath. Realizing infrared light absorption in a long beam distance due to multipath as thus described eliminates the need for making the film thickness of the infrared light absorbing layer large in order to improve absorption efficiency, and allows reduction in film thickness of the infrared light absorbing layer into one half of the conventional one, for example.

Further, when the infrared light reflected in the upper part is returned to the lower part and reaches an interface between the infrared light guiding layer 7 and the second reflecting layer 8, the infrared light incident on this interface at a larger angle than a critical angle is re-reflected also on this interface since the second reflecting layer 8 is formed of a film with a lower refractive index than that of the infrared light guiding layer 7. For example, when a film with a refractive index of 3.8 is used as the infrared light guiding layer 7 and a film with a refractive index of 3.1 is used as the second reflecting layer 8, the critical angle is about 55°, and the infrared light incident at a larger angle than about 55° is re-reflected on this interface.

Figure 8:
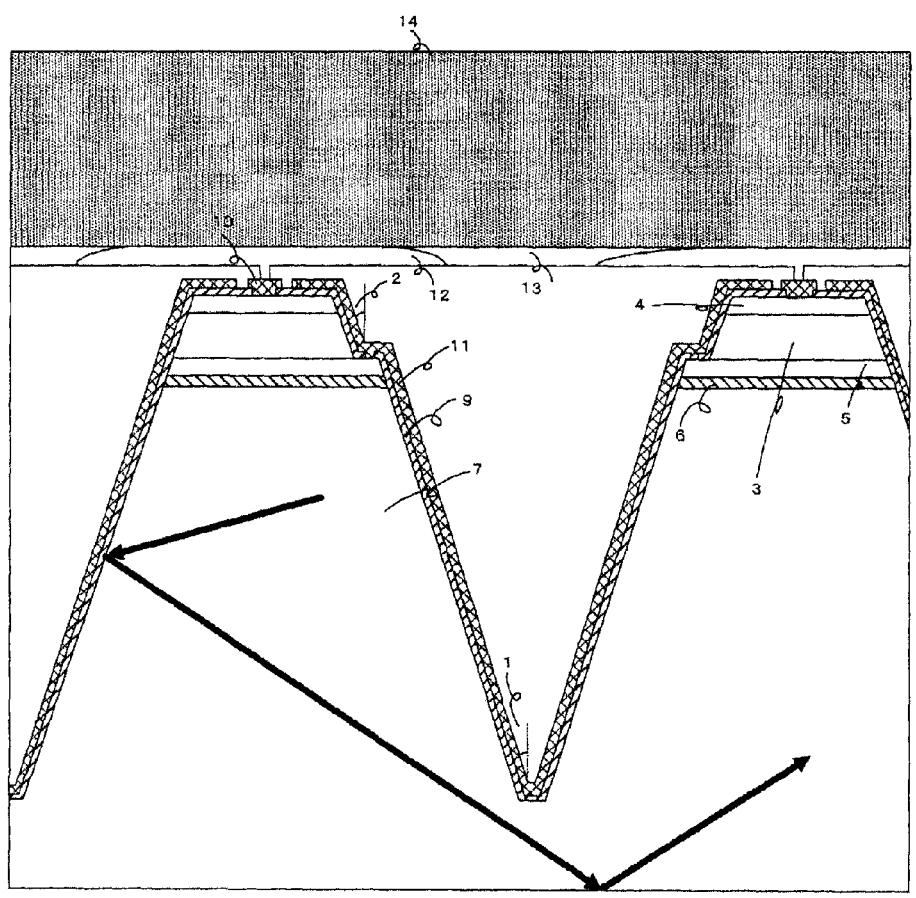
FIG. 8 is an explanatory view concerning leakage of infrared light into an adjacent pixel in a case without a second reflecting layer.

Here, when the second reflecting film 8 does not exist and this portion is also formed of the infrared light guiding layer 7 as shown in FIG. 8, the infrared light incident at a high incident angle on an interface between the infrared light guiding layer 7 and the outside is leaked into an adjacent pixel due to reflection on this interface, or the like, which causes occurrence of a cross talk between pixels. In contrast, in the quantum-type infrared solid-state imaging device 100 according to the first embodiment of the present invention, with the existence of the second reflecting layer 8, the infrared light returned to the lower part at a high incident angle is re-reflected on the interface between the infrared light guiding layer 7 and the second reflecting layer 8, and is not incident on the adjacent pixel, thereby allowing prevention of leakage of the infrared light into the adjacent pixel.

For example, in the case where the detecting section is a compound semiconductor detecting section of InSb, InAsSb, InAs or the like or a detecting section using an GaSb/InAs type-II superlattice, an InGaSb/InAs type-II superlattice, an InAs/InAsSb type-II superlattice or the like, the above effect can be obtained when a single film with a refractive index of a value from 3.5 to 4.5 such as InSb, InAsSb, InAs, GaSb or InGaSb or a laminated film of a plurality of these films is, for example, used for the lower contact layer 5 and the infrared light guiding layer 7 and a single film with a refractive index of a value from 2.8 to 3.5 such as AlAs, AlSb, AlGaSb or AlGaAsSb or a laminated film of a plurality of these films is used for the first reflecting layer 6 and the second reflecting layer 8.

Here, in formation of the first reflecting layer 6 and the second reflecting layer 8, it is necessary to set a lattice constant of a film to be formed to a value extremely close to a lattice constant of the substrate and/or the infrared light absorbing layer 3, so as to prevent occurrence of a dislocation defect due to lattice relaxation caused by lattice inconsistency. This is because, in the case of occurrence of the dislocation defect in the vicinity of the infrared light absorbing layer 3, characteristics as the infrared solid-state imaging device significantly deteriorate. For example, in the compound semiconductor detecting section or the type-II superlattice detecting section necessarily containing Sb or In and consisting of at least two elements out of elements Ga, Sb, In, As and Al, which is handled in the first embodiment of the present invention, the material used for the lower contact layer 5 and the infrared light guiding layer 7 is, for example, InSb, InAsSb, InAs, GaSb or InGaSb and refractive index thereof is as high as around 4 such as 3.5 to 4.5 as described above. It can be said that the existence of the material suitable for the present invention such as AlAs, AlSb, AlGaSb or AlGaAsSb each having a lattice constant close to that of each of the above films and a refractive index as low as around 3 between 2.8 to 3.5 has made the present invention realizable.

On the other hand, for example, in a QWIP system described in Japanese Patent Application Laid-Open No. 2011-77165, GaAs or AlGaAs is used as the infrared light absorbing layer and the contact layer and its refractive index is a value as low as around 3, and hence there exists no material having a lattice constant close to that of each of these material and a refractive index still lower than that of each of these materials. Therefore, in Japanese Patent Application Laid-Open No. 2011-77165, part of a role of the reflecting layer is substituted by reflection by a convex-concave structured grating on the front surface, but in this case, a convex-concave structured grating region cannot be formed in contact with the lowermost part of the groove. This is because formation of the region in contact with the lowermost part of the groove causes insufficient strength of the thinned substrate. Therefore, a region such as a residual layer of the contact layer or the substrate after being made thinner exists between the convex-concave structured grating region and the lowermost part of the groove, leading to occurrence of leakage of infrared light into a laterally adjacent pixel through this region. In short, the quantum-type infrared solid-state imaging device 100 according to the first embodiment of the present invention for the first time solved the problem of preventing infrared light from being leaked into the adjacent pixel.

Further, in the quantum-type infrared solid-state imaging device 100 according to the first embodiment of the present invention, different from the conventional structure, the groove is formed still deeper than the lower contact layer 5, to allow collection of infrared light on the infrared light absorbing layer 3 having a small volume with respect to a pixel pitch by use of reflection by the first insulating layer 9 and the second metal wiring 11 which are formed on the groove side wall. That is, it is the characteristic of the present invention that the groove is extended to a much lower layer than the layer to perform photoelectric conversion such as the infrared light absorbing layer and the contact layer, or the layer to electrically exchange electric charges generated due to photoelectric conversion.

Here, for example, in the conventional example shown in Japanese Patent Application Laid-Open No. 2011-77165, the lower contact layer is formed not being separated but laterally linked in the two-dimensional pixel array 18. The lower contact layer is then connected to the electrode as a common electrode at an edge of the two-dimensional pixel array 18, and connected with the silicon reading circuit chip 14 by bump connection. Accordingly, the lower electrode can be made to serve as the common electrode of the two-dimensional pixel array 18, and it is only the metal wiring 23 connected to the upper contact layer 4 that is connected with the silicon reading circuit chip 14 by bump connection for each pixel, and one bump is formed with respect to each pixel. This results in facilitating the manufacturing process as compared to the case of forming a plurality of bumps within a narrow pixel pitch.

On the other hand, in the case of forming the groove still deeper than the lower contact layer 5 as in the quantum-type infrared solid-state imaging device 100 according to the first embodiment of the present invention, the lower contact layer 5 cannot be formed as laterally linked inside the two-dimensional pixel array 18, and cannot be connected as the common electrode with the silicon reading circuit chip 14 by bump connection at the edge of the two-dimensional pixel array 18. Further, in the conventional structure, as shown in FIG. 5, even when the lower contact layer 5 is separated for each pixel, if it is laterally connected in the layer under the lower contact layer 5, it can be connected as the common electrode with the silicon reading circuit chip 14 by bump connection.

However, in the quantum-type infrared solid-state imaging device 100 according to the first embodiment of the present invention, the first reflecting layer 6 is formed under the lower contact layer 5. Generally, a band gap of the first reflecting layer 6 formed of a material with a lower refractive index than that of the lower contact layer 5 tends to be wide, and an energy band barrier against carriers (electrons and holes) is formed on the interface between the lower contact layer 5 and the first reflecting layer 6. Hence electric connection in the lower layer cannot be realized, either. Hence in the quantum-type infrared solid-state imaging device 100 according to the first embodiment of the present invention, the lower contact layer 5 of each pixel is connected to the second metal wiring 11 formed on the groove side wall via the electric connection section 16 of the second metal wiring to the lower contact layer. Since the second metal wiring 11 is formed as linked on the whole surface inside the two-dimensional pixel array 18, it can be connected as the common electrode with the silicon reading circuit chip 14 by bump connection at the edge of the two-dimensional pixel array 18. That is, the second metal wiring 11 formed on the groove side wall in the quantum-type infrared solid-state imaging device 100 according to the first embodiment of the present invention simultaneously realizes a function as the reflecting film formed on the groove and a function of electrically connecting the lower contact layer 5 of each pixel on the whole surface inside the two-dimensional pixel array 18.

Figure 7:
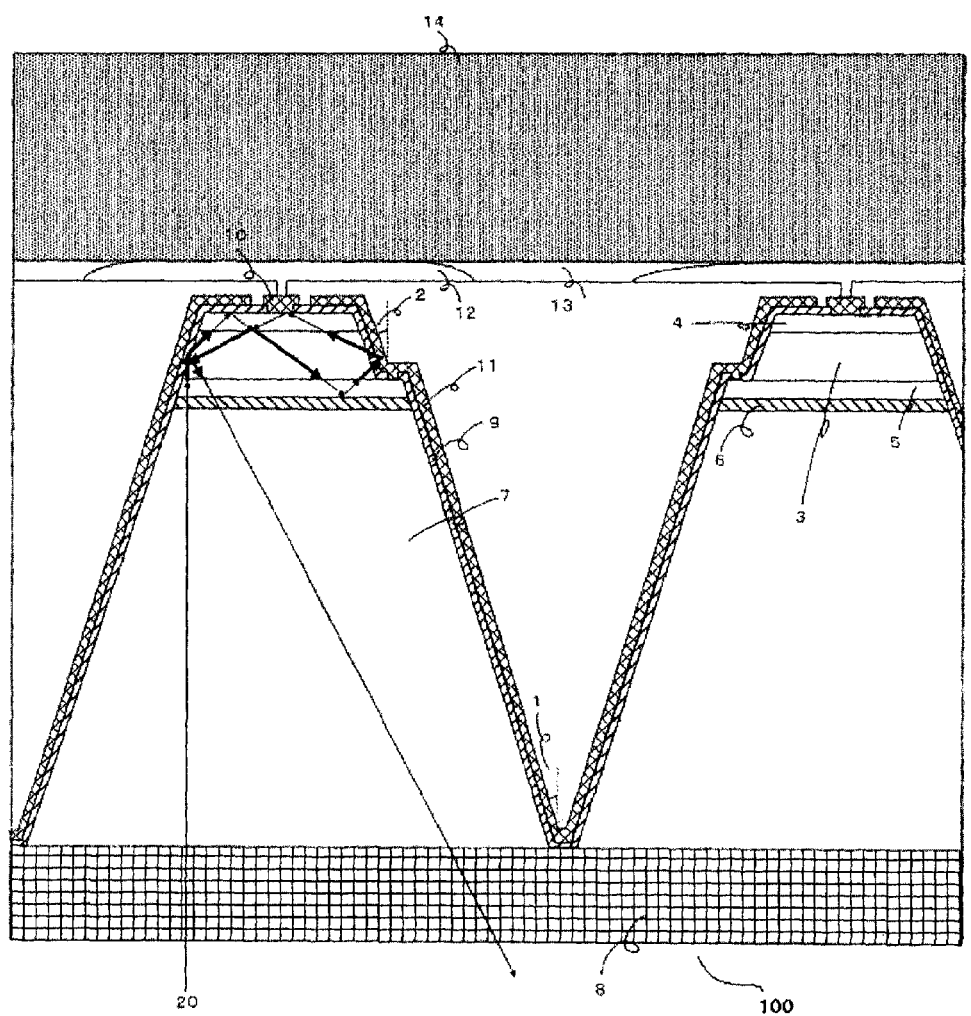
FIG. 7 is a sectional view of the infrared solid-state imaging device according to the first embodiment of the present invention.

FIG. 7 is a sectional view of the infrared solid-state imaging device 100 according to the first embodiment of the present invention, and shows a different incident path of infrared light from that in FIG. 6. Even with such an incident path, multiple reflection occurs, and a similar effect to that in FIG. 6 can be obtained. As thus described, when the incident infrared light 20 is incident so as to fall on an inclined portion of the groove side wall, infrared light absorption with high efficiency is realized in a long beam distance due to multipath formed by multiple reflection. When the incident infrared light 20 is incident around the center of the pixel, it does not fall on the inclined portion of the groove side wall, whereby the beam path is formed as conventional as shown in FIG. 5, and multiple reflection does not occur. Accordingly, by making a region, other than the inclined portion of the groove side wall, as short as possible within the pixel pitch, the characteristics can be improved.

In the infrared solid-state imaging device 100 according to the first embodiment of the present invention, by the infrared light reflecting operation by the first insulating layer 9 and the second metal wiring 11 which are formed on the groove side wall, it is possible to collect the infrared light incident within the pixel pitch in the infrared light absorbing layer 3 with a narrower width than the pixel pitch without leaking the infrared light. That is, it is possible to guide the incident light to the infrared light absorbing layer, which is formed with a significantly smaller width as compared to the pixel pitch (e.g., a width being one third of the pixel pitch), in both the first direction of the two-dimensional pixel array and the second direction perpendicular to the first direction without leaking the incident light, namely without impairing the sensitivity characteristics (mass efficiency). In order to efficiently achieve such light collecting operation, the groove taper angle 1 is optimally 15° to 30°, for example.

As thus described, it has hitherto been necessary to make the infrared light absorbing layer 3 thick in order to obtain high mass efficiency, but in the infrared solid-state imaging device 100 according to the first embodiment of the present invention, by absorbing the infrared light in a long beam distance due to multipath, even when the infrared light absorbing layer is made with a film thickness approximately one half of that in the conventional structure, it is possible to absorb infrared light of the same level.

Moreover, in the infrared solid-state imaging device 100 according to the first embodiment of the present invention, it is possible to use the infrared light absorbing layer 3 with a significantly smaller width as compared to the pixel pitch (e.g., a width being one third of the pixel pitch) in both the first and the second directions of the two-dimensional pixel array. Hence it is possible to significantly reduce a volume of the infrared light absorbing layer 3 to approximately $1/(3\times3\times2)=1/18$ as compared to that in the conventional structure. As a result, it is possible to significantly reduce a dark current generated (mainly caused by a leakage current due to SRH generation) in proportion to the volume of the infrared light absorbing layer, and achieve a high S/N and a high-temperature operation.

Further, in the infrared solid-state imaging device 100 according to the first embodiment of the present invention, formation of the second reflecting layer 8 allows re-reflection of the infrared light returned to the lowermost part of the pixel at a high incident angle, thereby allowing a further increase in absorption of the infrared light and prevention of leakage of the infrared light to the adjacent pixel.

It is to be noted that, when the infrared light is collected and efficiently absorbed by the infrared light absorbing layer 3 made up of the compound semiconductor detecting section or the type-II superlattice detecting section, photoelectric conversion occurs, and electric charges are generated inside the infrared light absorbing layer 3. The generated electric charges pass through the upper contact layer 4, the first metal wiring 10 and the bump electrode 12, and flows to a charge reading circuit for each pixel of the silicon reading circuit chip 14. Here, the lower contact layer 5 connected to the second metal wiring 11 is supplied with, for example, a ground potential via the silicon reading circuit chip 14. Another appropriate potential may be applied. Electric connection between the second metal wiring 11 and the silicon reading circuit chip 14 is not necessarily formed for each pixel, but may be formed in the vicinity of the outer circumference of the pixel two-dimensional array.

The charge reading circuit for each pixel of the silicon reading circuit chip 14 executes a function of reading electric charges while applying a desired bias to the corresponding bump electrode 12. For example in the case of the pin structure, a negative bias such as −0.1 V to −2 V is applied to the bump electrode 12. In the silicon reading circuit chip 14, electric charge reading is performed in the charge reading circuit for each pixel, integration reading is performed in an integration circuit, and the read data is outputted as an electric signal through amplification and the like in an amplification circuit. Outputting is performed from an input/output pad 19. In the input/output pad 19, power supply, clock supply and the like to the silicon reading circuit chip 14 are also performed.

Although the description has been given taking the detecting section with the pin structure in the infrared solid-state imaging device 100 according to the first embodiment of the present invention, a structure other than the pin structure may be used so long as the detecting section is one having the function of detecting infrared light.

As described above, in the infrared solid-state imaging device 100 according to the first embodiment of the present invention, it is possible to absorb infrared light in a long beam distance due to multipath, so as to improve sensitivity characteristics (mass efficiency). As a result, it is possible to significantly reduce the volume of the infrared light absorbing layer as compared to the conventional one, and to significantly reduce a dark current generated (mainly caused by a leakage current due to SRH generation) in proportion to the volume of the infrared light absorbing layer, so as to achieve a high S/N and a high-temperature operation. Moreover, leakage of infrared light to the adjacent pixel is also prevented.

Second Embodiment

Figure 9:
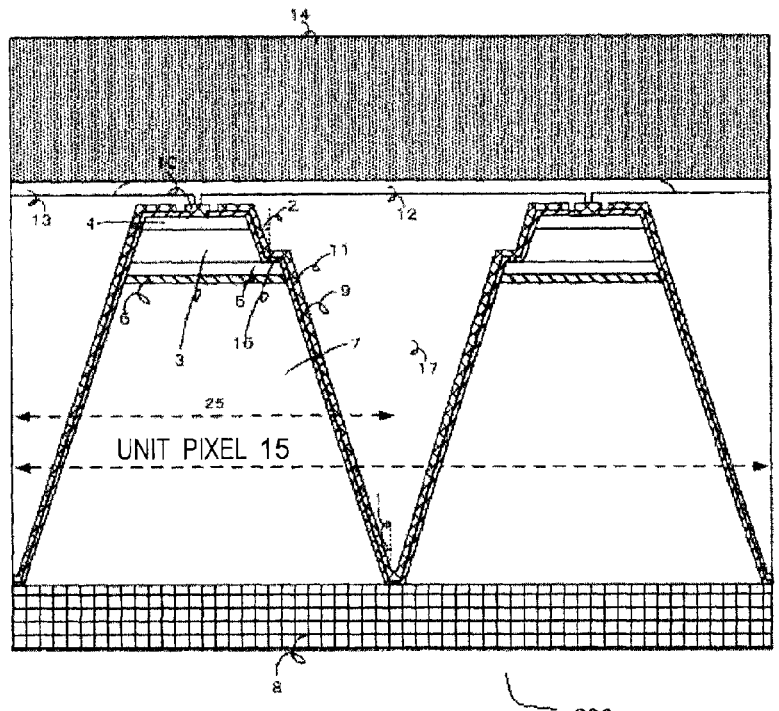
FIG. 9 is a sectional view of an infrared solid-state imaging device according to a second embodiment of the present invention.
Figure 10:
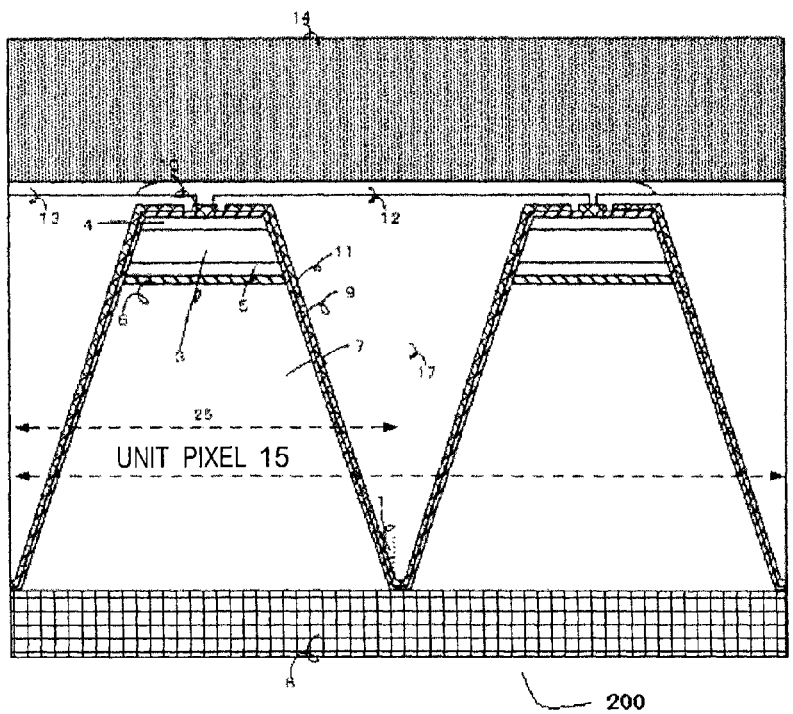
FIG. 10 is a sectional view of the infrared solid-state imaging device according to the second embodiment of the present invention.

FIG. 9 is a sectional view of an infrared solid-state imaging device according to a second embodiment of the present invention, generally denoted by numeral 200. Further, FIG. 10 is a sectional view of the infrared solid-state imaging device 200 in a direction orthogonal to FIG. 9. In FIGS. 9 and 10, the same numerals as those in FIGS. 1 and 2 denote the same or corresponding elements.

In the infrared solid-state imaging device 200 according to the second embodiment of the present invention, a plurality of unit detecting sections 25 separated by grooves are electrically connected, to form the unit pixel 15. Specifically, as shown in FIGS. 9 and 10, two unit detecting sections 25 in the first direction of the two-dimensional pixel array and two unit detecting sections 25 in the second direction perpendicular to the first direction, a total of four (2×2) of the unit detecting sections 25, are electrically connected, to form the unit pixel 15.

A space between the first metal wiring 10 of the two unit detecting sections 25 adjacent in the first direction and the first metal wiring 10 of the two unit detecting sections 25 adjacent in the second direction are electrically connected in the bump electrode 12.

In the infrared solid-state imaging device 200 according to the second embodiment of the present invention, since a pitch of the unit detecting section can be made smaller than the pixel pitch, when a ratio of a width of the infrared light absorbing layer 3 with respect to the pitch of the unit detecting section is made the same and the light collection effect by use of reflection by the first insulating layer 9 and the second metal wiring 11 which are formed on the groove side wall is made the same, it is possible to make a depth of the groove smaller as compared to that in the case of the first embodiment where the pitch of the unit detecting section is the same as the pixel pitch.

The deeper the groove becomes, the more difficult it becomes to form the groove by etching and embed the first insulating layer 9 and the second metal wiring 11 into the groove. However, in the present second embodiment, it is possible to remove such a restriction, and to achieve a large light collection effect and reduction in volume of the infrared light absorbing layer 3. As a result, it is possible to reduce more dark current noise and to achieve a higher-temperature operation.

Third Embodiment

Figure 11:
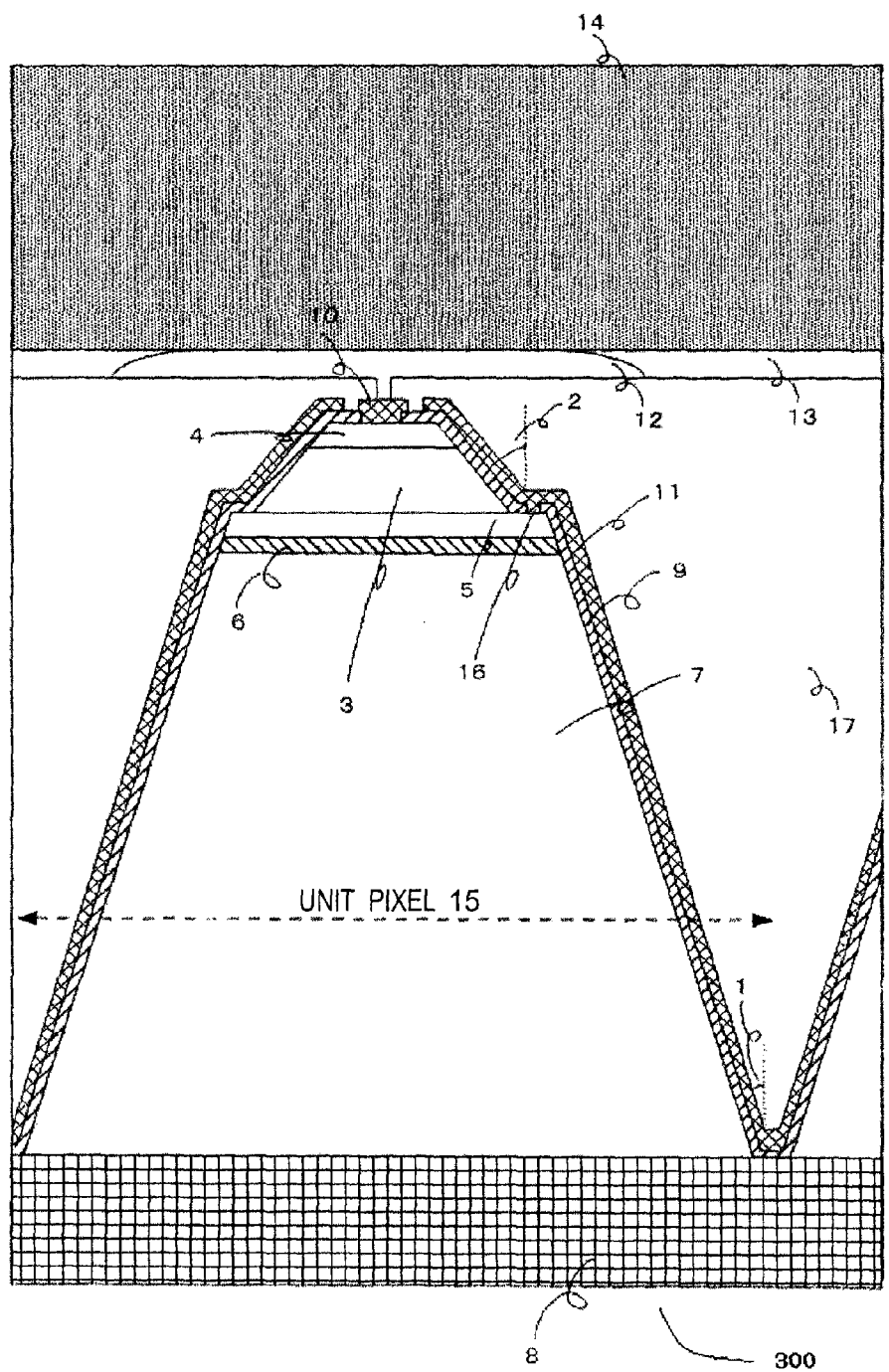
FIG. 11 is a sectional view of an infrared solid-state imaging device according to a third embodiment of the present invention.

FIG. 11 is a sectional view of an infrared solid-state imaging device according to a third embodiment of the present invention, generally denoted by numeral 300. In FIG. 11, the same numerals as those in FIGS. 1 and 2 denote the same or corresponding elements.

In the infrared solid-state imaging device 300 according to the third embodiment of the present invention, the electric connection section of the second metal wiring to the lower contact layer is not formed in a cross section orthogonal to FIG. 11 as in FIG. 10.

In the infrared solid-state imaging device 300 according to the third embodiment of the present invention, the groove taper angle 2 is made larger than the groove taper angle 1, and the groove above the lower contact layer 5 is formed with a gentler inclination than the groove therebelow. It is thereby possible to make a width of the upper portion of the infrared light absorbing layer 3 smaller, and more greatly reduce the volume of the infrared light absorbing layer 3. As a result, it is possible to reduce more dark current noise and to enable a higher-temperature operation.

Fourth Embodiment

Figure 12:
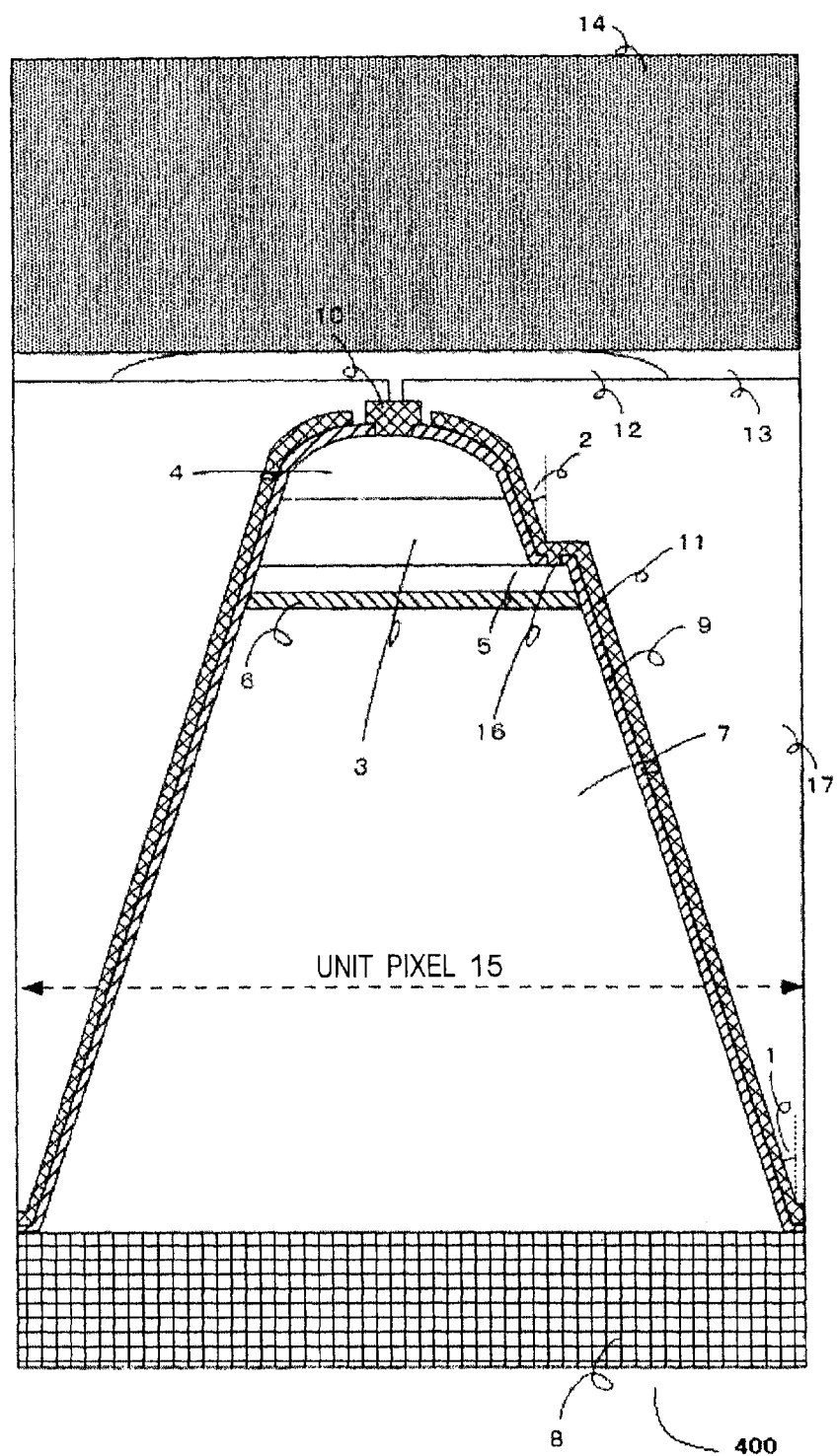
FIG. 12 is a sectional view of an infrared solid-state imaging device according to a fourth embodiment of the present invention.

FIG. 12 is a sectional view of an infrared solid-state imaging device according to a fourth embodiment of the present invention generally denoted by numeral 400. In FIG. 12, the same numerals as those in FIGS. 1 and 2 denote the same or corresponding elements.

In the infrared solid-state imaging device 400 according to the fourth embodiment of the present invention, the electric connection section of the second metal wiring to the lower contact layer is not formed in a cross section orthogonal to FIG. 12 as in FIG. 10.

In the infrared solid-state imaging device 400 according to the fourth embodiment of the present invention, as shown in FIG. 12, the top surface of the upper contact layer 4 is formed in a convex spherical shape. In the first embodiment, when the infrared light is directly incident on the top surface of the upper contact layer 4, the infrared light does not fall on the inclined portion of the groove side wall, and hence the beam path becomes the conventional beam path as shown in FIG. 5, to cause the existence of an infrared light incident region where the light collection effect is not produced.

In contrast, in the infrared solid-state imaging device 400 according to the fourth embodiment of the present invention, by forming the top surface of the upper contact layer 4 in the convex spherical shape, the incident light reflected on the top surface of the upper contact layer 4 can also be reflected in an oblique direction, and the beam distance at which infrared light absorption occurs can be made longer. It is thereby possible to make the film thickness of the infrared light absorbing layer 3 smaller and to reduce the volume of the infrared light absorbing layer 3 more, so as to reduce more dark current noise and enable a higher-temperature operation.

Fifth Embodiment

Figure 13:
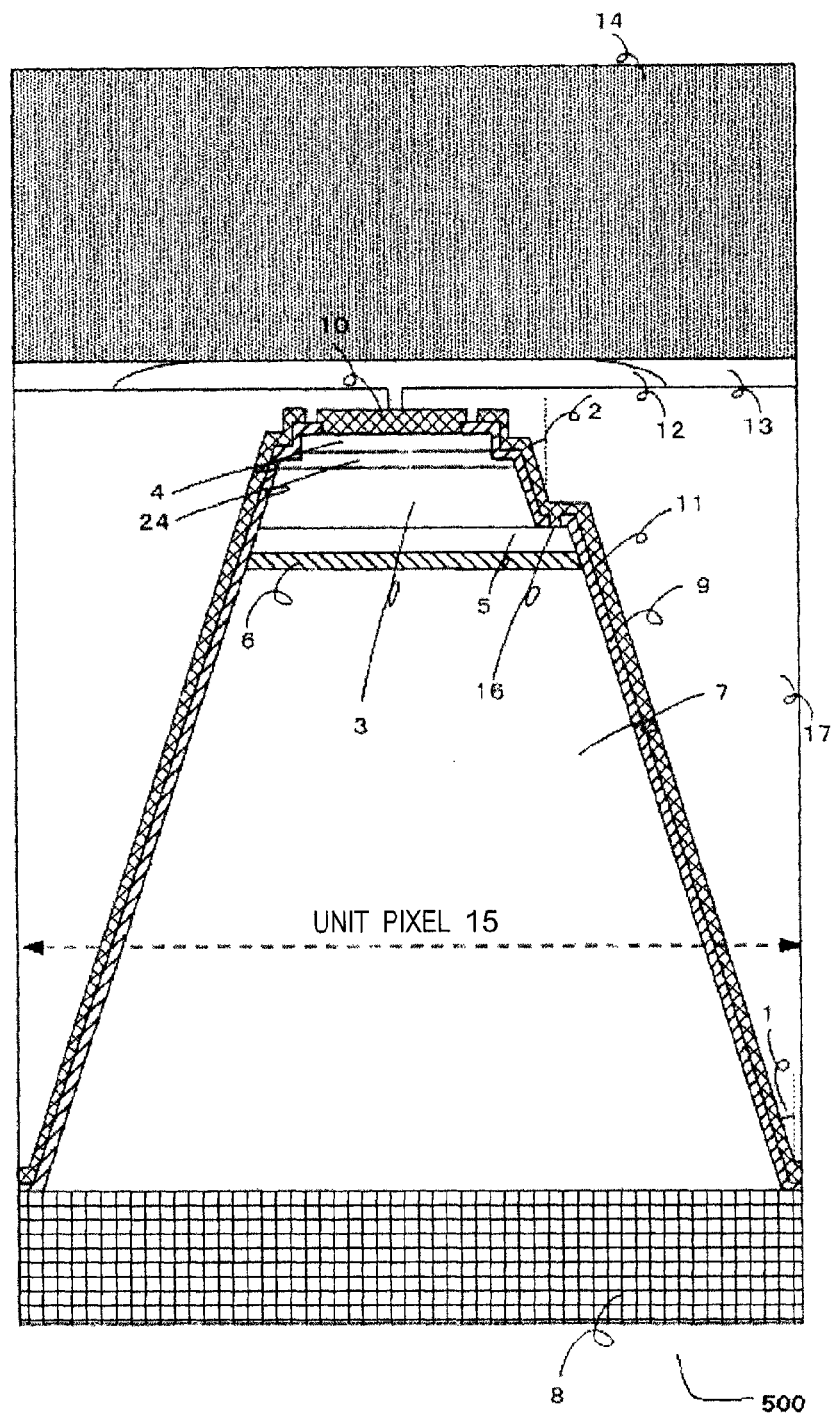
FIG. 13 is a sectional view of an infrared solid-state imaging device according to a fifth embodiment of the present invention.

FIG. 13 is a sectional view of an infrared solid-state imaging device according to a fifth embodiment of the present invention, generally denoted by numeral 500. In FIG. 13, the same numerals as those in FIGS. 1 and 2 denote the same or corresponding elements.

In the infrared solid-state imaging device 500 according to the fifth embodiment of the present invention, the electric connection section of the second metal wiring to the lower contact layer is not formed in a cross section orthogonal to FIG. 13 as in FIG. 10.

The infrared solid-state imaging device 500 according to the fifth embodiment of the present invention is structured such that a barrier layer 24 is held between the infrared light absorbing layer 3 and the upper contact layer 4, as compared to the infrared solid-state imaging device 100 of the first embodiment. The other structures are similar to those of the infrared solid-state imaging device 100.

The unit pixel 15 is configured of a barrier structure-type detecting section using the compound semiconductor infrared light absorbing layer or the type-II superlattice infrared light absorbing layer, which necessarily contains Sb or In and consists of at least two elements out of elements Ga, Sb, In, As and Al. The barrier-type detecting section means an nBn structure applied with a barrier diode, which is a unipolar device commonly known as "bariode", and has been proposed by S. Maimon et al. (S. Maimon et al., "nBn detector, an infrared detector with reduced dark current and higher operating temperature", Appl. Phys. Lett., 89, 151109 (2006)).

As the type-II superlattice infrared light absorbing layer, there is, for example, an infrared light absorbing layer using a GaSb/InAs type-II superlattice, an InGaSb/InAs type-II superlattice, an InAs/InAsSb type-II superlattice or the like. As the compound semiconductor infrared light absorbing layer, there is, for example, a compound semiconductor infrared light absorbing layer of InSb, InAsSb, InAs or the like. Taking InAsSb as an example, first, the upper contact layer 4, the infrared light absorbing layer 3 and the lower contact layer 5 are formed in the n-type InAsSb layer. However, generally, the infrared light absorbing layer 3 is formed with a lower n-type impurity concentration than an n-type impurity concentrations of the upper contact layer 4 and the lower contact layer 5. A material for the barrier layer 24 is selected and formed such that, on an interface between the barrier layer 24 and the upper contact layer 4, an energy band barrier is formed against majority carriers (electrons) (in a conductive band) and no energy band barrier is formed against minority carriers (holes) (in a valance band). For example, the n-type AlSbAs layer satisfies this condition.

A pBp structure using the p-type instead of the n-type may be formed. In this case, the material for the barrier layer 24 is selected and formed such that, on the interface between the barrier layer 24 and the upper contact layer 4, an energy band barrier is formed against majority carriers (holes) (in the valance band) and no energy band barrier is formed against minority carriers (electrons) (in the conductive band). Moreover, any type out of a variety of barrier structure-type detecting sections using the barrier layer may be used.

Also in the present fifth embodiment applied with the nBn structure, similarly to the first embodiment, it is possible to reduce the film thickness of the infrared light absorbing layer 3 by absorbing infrared light in a long beam distance due to multipath. Further, collection of the infrared light by reflection by the first insulating layer 9 and the second metal wiring 11 on the groove side wall allows significant reduction in volume of the infrared light absorbing layer 3, whereby it is possible to significantly reduce a dark current generated (mainly caused by a leakage current due to SRH generation) in proportion to the volume of the infrared light absorbing layer, so as to achieve a high S/N and a high-temperature operation. Moreover, formation of the second reflecting layer 8 allows re-reflection of the infrared light returned to the lowermost part of the pixel at a high incident angle, thereby allowing a further increase in absorption of the infrared light and prevention of leakage of the infrared light to the adjacent pixel.

Figure 14:
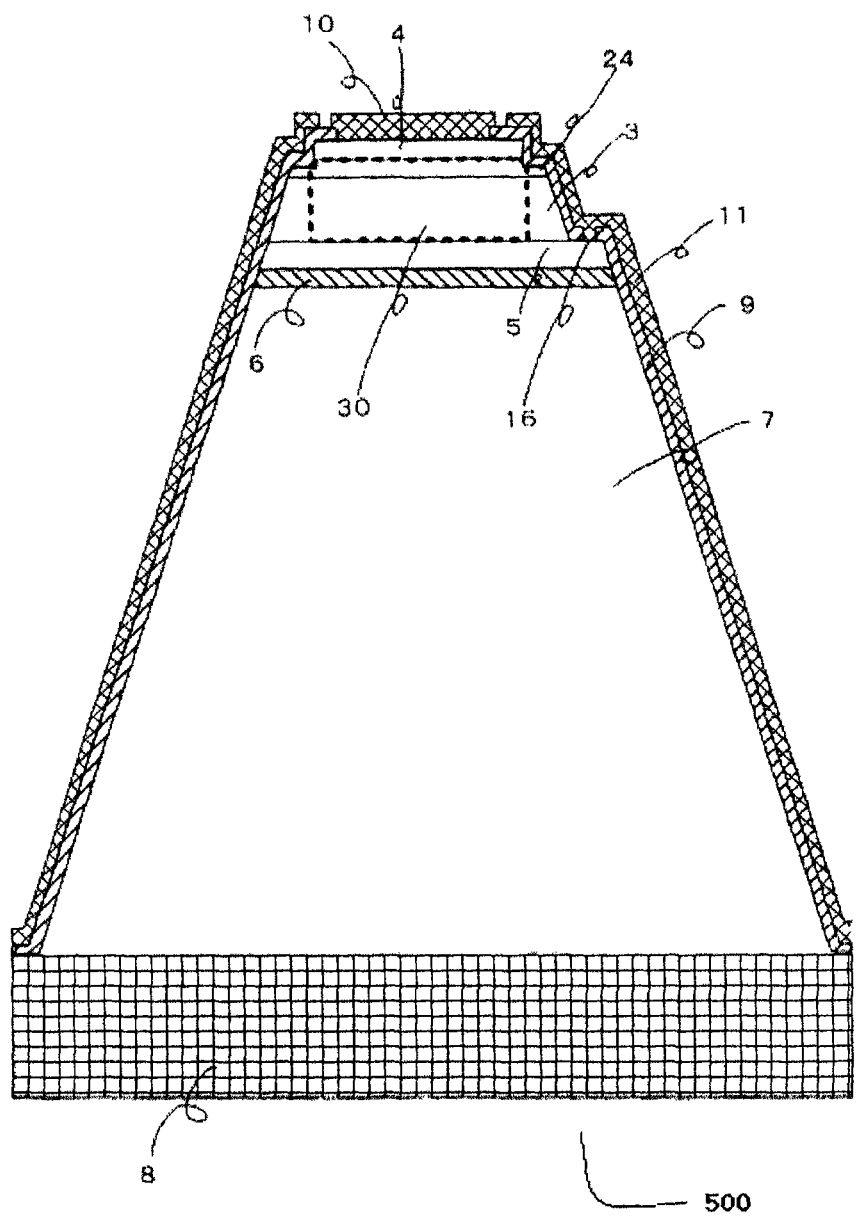
FIG. 14 is a sectional view of an nBn-type detecting section pixel in a shallow-etched shape used in the fifth embodiment of the present invention.

Furthermore, as seen from FIG. 13, the upper contact layer 4 and part of the barrier layer 24 are patterned inside the groove with the groove taper angle 2. This is a shallow-etched shape peculiar to the nBn structure, which is also shown by S. Maimon et al. described above. That is, in the nBn structure, different from the normal pin structure, when pixels are to be separated by the groove, the infrared light absorbing layer 3 is not necessarily required to be patterned simultaneously with patterning of the upper contact layer 4, and it is possible to achieve pixel separation just by patterning the upper contact layer 4 (or the upper contact layer 4 and part of the barrier layer 24). When this shallow-etched shape is adopted, a region where a photoelectric conversion current flows is decided depending on the patterning region of the upper contact layer 4 (to be exact, a region outside the patterning region of the upper contact layer 4 just by a laterally diffused length of minority carriers), and the photoelectric conversion current does not flow on an interface between the groove with the groove taper angle 1 and the groove with the groove taper angle 2, which is located further outside the patterning region of the upper contact layer 4. FIG. 14 shows a region 30 (indicated by a dotted line) where the photoelectric conversion current flows in the nBn-type detecting section pixel in the shallow-etched shape.

Therefore, a surface leakage current, which is generated when a current flows on the interface between the groove with the groove taper angle 1 and the groove with the groove taper angle 2 in the normal pin structure, is not generated in this nBn-type detecting section pixel in the shallow-etched shape. In the infrared solid-state imaging device 500 according to the fifth embodiment of the present invention, by having the nBn structure, it is possible to prevent the surface leakage current on the groove interface, which is generated due to formation of the grooves, so as to reduce more dark current noise and to achieve a higher-temperature operation.

What is claimed is:

1. An infrared solid-state imaging device provided with a plurality of unit detecting sections in a matrix form, each unit detecting section comprising:
an infrared light guiding layer;
a first reflecting layer provided on the infrared light guiding layer;
an infrared light detecting section provided on the first reflecting layer, the infrared light detecting section comprising an infrared light absorbing layer for absorbing infrared light, an upper contact layer provided on the infrared light absorbing layer, and a lower contact layer provided under the infrared light absorbing layer; and
first metal wiring electrically connected to the upper contact layer,
wherein a side wall of each unit detecting section is inclined at a taper angle smaller than 45° with respect to a normal direction of a bottom surface of the infrared light guiding layer, to form a groove between the unit detecting sections adjacent to each other,
a first insulating layer is provided on the side wall of the unit detecting section and second metal wiring is provided on the first insulating layer, and
a refractive index of the first reflecting layer is lower than a refractive index of the lower contact layer.

2. An infrared solid-state imaging device provided with a plurality of unit detecting sections in a matrix form, each unit detecting section comprising:
an infrared light guiding layer;
an infrared light detecting section provided on the infrared light guiding layer, the infrared light detecting section comprising an infrared light absorbing layer for absorbing infrared light, an upper contact layer provided on the infrared light absorbing layer, and a lower contact layer provided under the infrared light absorbing layer; and
first metal wiring electrically connected to the upper contact layer,
wherein the unit detecting section is provided on a second reflecting layer,
a side wall of each unit detecting section is inclined at a taper angle smaller than 45° with respect to a normal direction of a bottom surface of the infrared light guiding layer, to form a groove between the unit detecting sections adjacent to each other,
a first insulating layer is provided on the side wall of the unit detecting section and second metal wiring is provided on the first insulating layer, and
a refractive index of the second reflecting layer is lower than a refractive index of the infrared light guiding layer.

3. The infrared solid-state imaging device according to claim 1, further comprising a second reflecting layer on which the unit detecting section is provided, wherein a refractive index of the second reflecting layer is lower than a refractive index of the infrared light guiding layer.

4. The infrared solid-state imaging device according to claim 1, wherein each infrared light detecting section is a compound semiconductor detecting section or a type-II superlattice detecting section.

5. The infrared solid-state imaging device according to claim 1, wherein the second metal wiring is electrically connected to the lower contact layer.

6. The infrared solid-state imaging device according to claim 1, further comprising a barrier layer between the infrared light absorbing layer and the upper or lower contact layer, the barrier layer forming an energy band barrier against majority carriers flowing from the infrared light absorbing layer to the upper or lower contact layer.

7. The infrared solid-state imaging device according to claim 1, wherein the groove taper angle above the interface between the infrared light absorbing layer and the lower contact layer is larger than the groove taper angle below the interface.

8. The infrared solid-state imaging device according to claim 1, wherein the top surface of the upper contact layer is in the convex spherical shape.

9. The infrared solid-state imaging device according to claim 1, wherein a unit pixel is made of a plurality of each unit detecting sections, and all of the unit detecting sections in the unit pixel are commonly connected to the first metal wiring.

10. The infrared solid-state imaging device according to claim 1, wherein each infrared light detecting section necessarily contains Sb or In and consists of at least two elements selected from a group consisting of Ga, Sb, In, As and Al.

11. The infrared solid-state imaging device according to claim 2, wherein each infrared light detecting section is a compound semiconductor detecting section or a type-II superlattice detecting section.

12. The infrared solid-state imaging device according to claim 2, wherein the second metal wiring is electrically connected to the lower contact layer.

13. The infrared solid-state imaging device according to claim 2, further comprising a barrier layer between the infrared light absorbing layer and the upper or lower contact layer, the barrier layer forming an energy band barrier against majority carriers flowing from the infrared light absorbing layer to the upper or lower contact layer.

14. The infrared solid-state imaging device according to claim 2, wherein the groove taper angle above the interface between the infrared light absorbing layer and the lower contact layer is larger than the groove taper angle below the interface.

15. The infrared solid-state imaging device according to claim 2, wherein the top surface of the upper contact layer is in the convex spherical shape.

16. The infrared solid-state imaging device according to claim 2, wherein a unit pixel is made of a plurality of each unit detecting sections, and all of the unit detecting sections in the unit pixel are commonly connected to the first metal wiring.

17. The infrared solid-state imaging device according to claim 2, wherein each infrared light detecting section necessarily contains Sb or In and consists of at least two elements selected from a group consisting of Ga, Sb, In, As and Al.

* * * * *